United States Patent
Hoeppel

(10) Patent No.: US 9,780,078 B2
(45) Date of Patent: Oct. 3, 2017

(54) METHOD FOR PRODUCING OPTOELECTRONIC SEMICONDUCTOR DEVICES AND OPTOELECTRONIC SEMICONDUCTOR DEVICE

(71) Applicant: OSRAM Opto Semiconductors GmbH, Regensburg (DE)

(72) Inventor: Lutz Hoeppel, Alteglofsheim (DE)

(73) Assignee: OSRAM Opto Semiconductor GmbH, Regensburg (DE)

( * ) Notice: Subject to any disclaimer, the term of this patent is extended or adjusted under 35 U.S.C. 154(b) by 0 days.

(21) Appl. No.: 15/029,241

(22) PCT Filed: Sep. 2, 2014

(86) PCT No.: PCT/EP2014/068565
§ 371 (c)(1),
(2) Date: Jun. 23, 2016

(87) PCT Pub. No.: WO2015/055346
PCT Pub. Date: Apr. 23, 2015

(65) Prior Publication Data
US 2016/0300825 A1    Oct. 13, 2016

(30) Foreign Application Priority Data
Oct. 18, 2013  (DE) .......... 10 2013 111 496

(51) Int. Cl.
*H01L 33/00* (2010.01)
*H01L 25/16* (2006.01)
(Continued)

(52) U.S. Cl.
CPC ........ *H01L 25/167* (2013.01); *H01L 27/0248* (2013.01); *H01L 31/02002* (2013.01);
(Continued)

(58) Field of Classification Search
CPC .. H01L 25/167; H01L 31/02002; H01L 33/62
See application file for complete search history.

(56) References Cited

U.S. PATENT DOCUMENTS

| 8,324,082 B1 | 12/2012 | Liu et al. |
| 8,628,984 B2 * | 1/2014 | Wang .................... H01L 33/642 |
|  |  | 257/79 |

(Continued)

FOREIGN PATENT DOCUMENTS

| DE | 102006043843 A1 | 4/2007 |
| DE | 102007043877 A1 | 1/2009 |

(Continued)

OTHER PUBLICATIONS

Kojima A., et al., "A Fully Integrated Novel Wafer-Level LED Package (WL2P) Technology for Extremely Low-Cost Solid State Lighting Devices", IEEE International Interconnect Technology Conference, IITC 2012, San Jose, Jun. 4-6, 2012, 3 pgs.

*Primary Examiner* — Jamie C Niesz
(74) *Attorney, Agent, or Firm* — McDermott Will & Emery LLP

(57) ABSTRACT

The invention relates to a method for producing a plurality of optoelectronic semiconductor components (1), comprising the following steps: a) providing a semiconductor layer sequence (2) having a plurality of semiconductor body regions (200); b) providing a plurality of carrier bodies (3), which each have a first contact structure (31) and a second contact structure (32); c) forming a composite (4) having the semiconductor layer sequence and the carrier bodies in such a way that adjacent carrier bodies are separated from one another by interspaces (35) and each semiconductor body area is electrically conductive connected to the first contact structure and the second contact structure of the associated carrier body; and d) separating the composite into the plurality of semiconductor components, wherein the semi- (Continued)

Figure 1A:
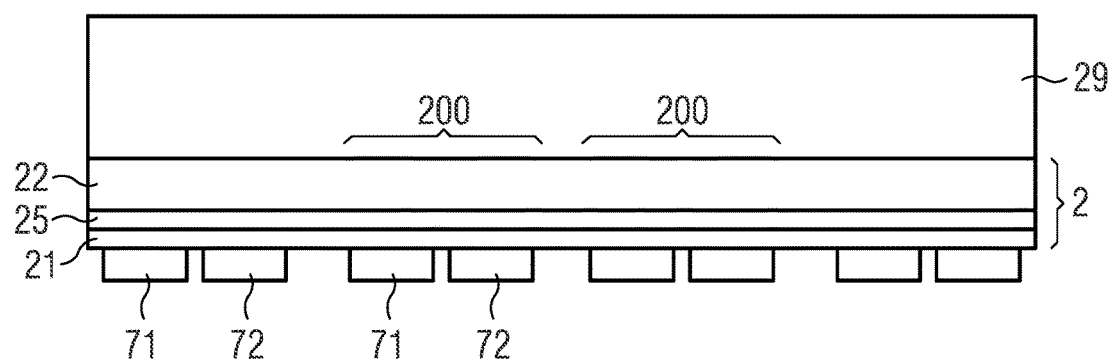

conductor components each have a semiconductor body (20) and a carrier body. The invention further relates to an optoelectronic semiconductor component (1).

12 Claims, 11 Drawing Sheets

(51) Int. Cl.
*H01L 31/02* (2006.01)
*H01L 33/62* (2010.01)
*H01L 27/02* (2006.01)
*H01L 31/0304* (2006.01)
*H01L 31/18* (2006.01)
*H01L 33/32* (2010.01)
*H01L 33/48* (2010.01)

(52) U.S. Cl.
CPC .. *H01L 31/02005* (2013.01); *H01L 31/03044* (2013.01); *H01L 31/1852* (2013.01); *H01L 31/1876* (2013.01); *H01L 33/0066* (2013.01); *H01L 33/0079* (2013.01); *H01L 33/0095* (2013.01); *H01L 33/32* (2013.01); *H01L 33/62* (2013.01); *H01L 33/486* (2013.01); *H01L 2924/0002* (2013.01); *H01L 2933/0066* (2013.01)

(56) References Cited

U.S. PATENT DOCUMENTS

| | | | |
|---|---|---|---|
| 8,766,312 B2* | 7/2014 | Sekine | H01L 33/486 257/100 |
| 2010/0203661 A1 | 8/2010 | Hodota | |
| 2013/0264592 A1* | 10/2013 | Bergmann | H01L 33/50 257/88 |

FOREIGN PATENT DOCUMENTS

| | | |
|---|---|---|
| DE | 102008011848 A1 | 9/2009 |
| DE | 102009032486 A1 | 1/2011 |
| DE | 102009036621 A1 | 2/2011 |
| DE | 10 2010 025 320 A1 | 12/2011 |
| DE | 102012217533 A1 | 3/2014 |
| DE | 102012218457 A1 | 4/2014 |
| EP | 2535954 A1 | 12/2012 |
| JP | 2010016055 A | 1/2010 |
| WO | 2013050898 A1 | 4/2013 |
| WO | 2013094083 A1 | 6/2013 |

* cited by examiner

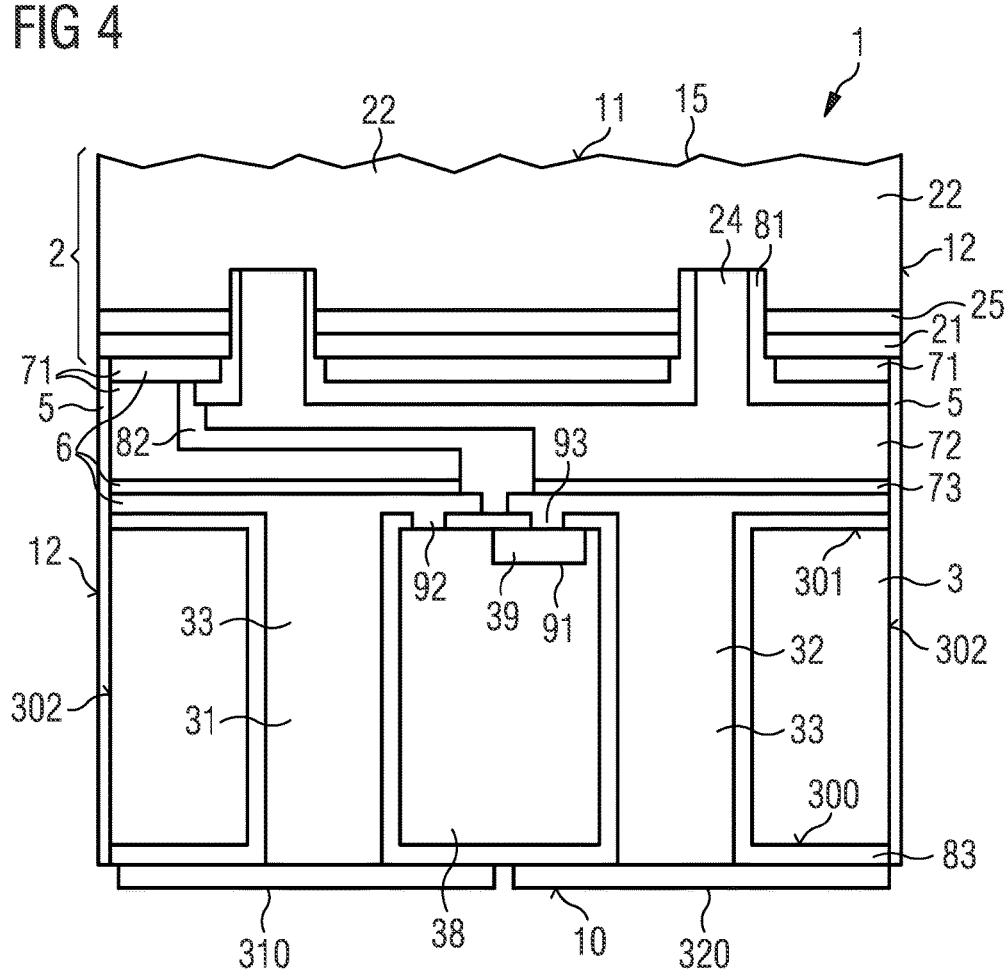

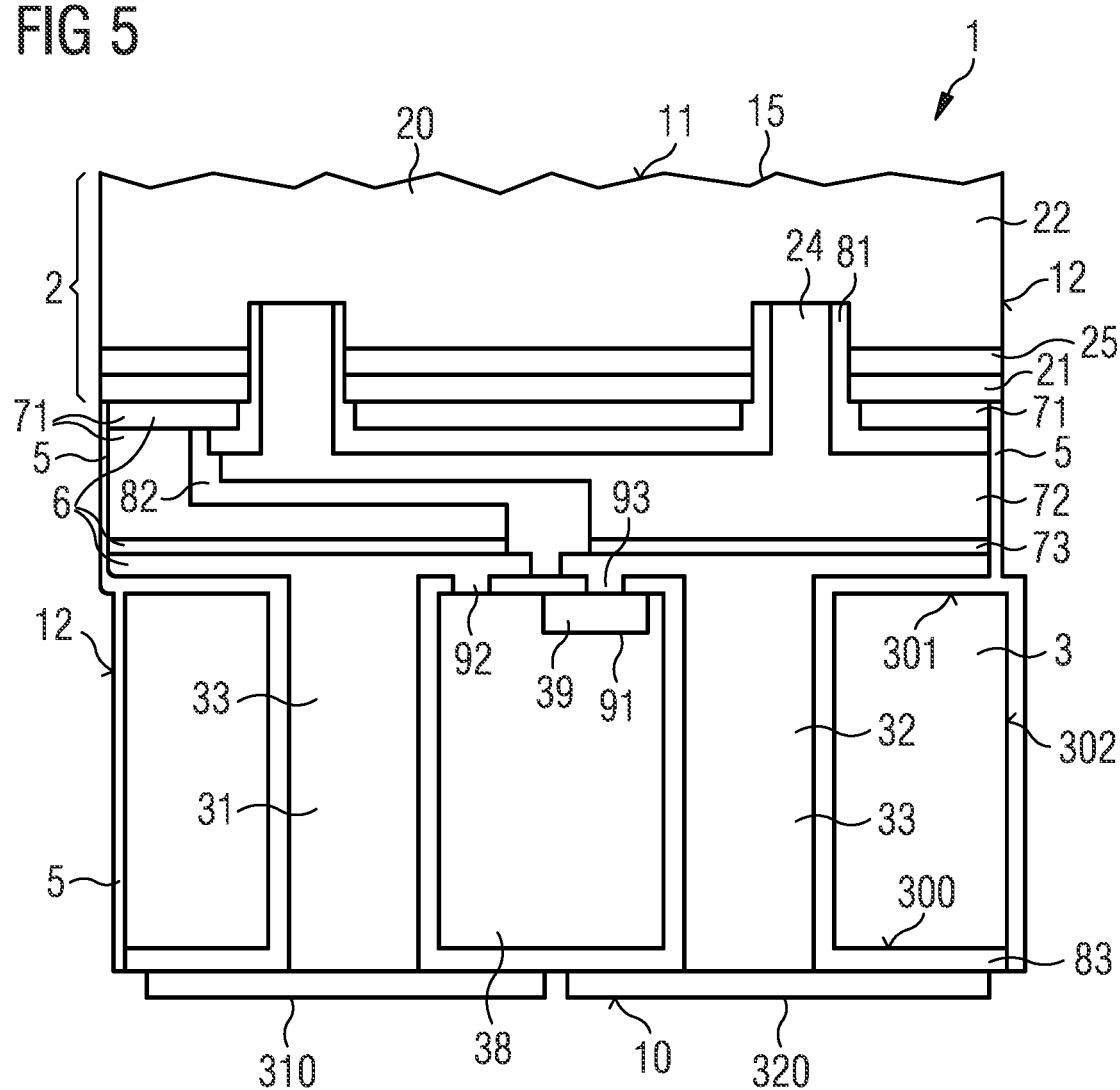

METHOD FOR PRODUCING OPTOELECTRONIC SEMICONDUCTOR DEVICES AND OPTOELECTRONIC SEMICONDUCTOR DEVICE

The present application relates to a method for producing optoelectronic semiconductor devices and to an optoelectronic semiconductor device.

With increasing requirements for miniaturizing semiconductor devices, there is an increased demand for optoelectronic semiconductor devices, such as for example luminescent diodes, in which the housing for the semiconductor chips provided for generating radiation or receiving radiation is not, or at least is not substantially, greater in its lateral extent than the semiconductor chips themselves.

However, the production of such designs having equally good optoelectronic properties represents a technological challenge.

It is an object to provide a method, by means of which particularly compact optoelectronic semiconductor devices can be produced in a simple and reliable manner. Furthermore, an optoelectronic semiconductor device is to be provided which is characterized by a compact design and at the same time good optoelectronic properties.

These objects are achieved inter alia by a method or a semiconductor device according to the independent claims. Embodiments and developments are described in the dependent claims.

A method for producing a plurality of optoelectronic semiconductor devices is provided.

According to at least one embodiment of the method, the method includes a step in which a semiconductor layer sequence having a plurality of semiconductor body regions is provided. A semiconductor body region is understood to be a lateral region of the semiconductor layer sequence, from which a semiconductor body, in particular precisely one semiconductor body, of an optoelectronic semiconductor device is produced during production of the optoelectronic semiconductor devices. For example, the semiconductor layer sequence includes an active region provided to generate and/or to receive electromagnetic radiation. For example, the active region is arranged between a first semiconductor layer of a first conductivity type and a second semiconductor layer of a second conductivity type different from the first conductivity type. For electrically contacting the second semiconductor layer, each semiconductor body region comprises, for example, a recess or a plurality of recesses which extend through the first semiconductor layer and the active region into the second semiconductor layer.

According to at least one embodiment of the method, the method includes a step in which a plurality of carrier bodies are provided. The carrier bodies each have, for example, a first contact structure and a second contact structure. In an expedient manner, the first contact structure and the second contact structure are not directly connected to each other in an electrically conductive manner. The carrier bodies preferably contain, or consist of, a semiconductor material, e.g. silicon or germanium.

The carrier bodies can be arranged, for example, on an auxiliary carrier, for instance a rigid auxiliary carrier or a flexible auxiliary carrier.

According to at least one embodiment of the method, the method includes a step in which a composite having the semiconductor layer sequence and the carrier bodies is formed. The carrier bodies are attached to the semiconductor body regions such that adjacent carrier bodies are separated from each other by clearances and each semiconductor body region is connected to the first contact structure and the second contact structure of the associated carrier body in an electrically conductive manner.

According to at least one embodiment of the method, the method includes a step in which the composite is singulated into the plurality of semiconductor devices, wherein the semiconductor devices each comprise one semiconductor body and one carrier body. When singulating the composite, semiconductor devices are produced whose lateral extent is not, or at least is not substantially, greater than the edge length of the semiconductor bodies. "Not substantially greater" means in this context in particular that the edge length of the singulated semiconductor devices is at the most 5% greater than the edge length of the semiconductor bodies in the same direction.

In at least one embodiment of the method, a semiconductor layer sequence having a plurality of semiconductor body regions is provided. A plurality of carrier bodies, which each have a first contact structure and a second contact structure, is provided. A composite having the semiconductor layer sequence and the carrier bodies is formed such that adjacent carrier bodies are separated from each other by clearances and each semiconductor body region is connected to the first contact structure and the second contact structure of the associated carrier body in an electrically conductive manner. The composite is singulated into the plurality of semiconductor devices, wherein the semiconductor devices each have one semiconductor body and one carrier body.

When forming the composite, the individual carrier bodies of the semiconductor devices to be produced are already separate elements which are not contiguous with one another. In comparison with a method in which a carrier is applied onto the entire surface of the semiconductor layer sequence and is only singulated into individual carrier bodies when singulating into semiconductor devices, the requirement for adapting the coefficients of thermal expansion of the substrate on which the semiconductor layer sequence is arranged, and for the material of the carrier bodies is reduced.

According to at least one embodiment of the method, the semiconductor layer sequence is provided on a growth substrate. The semiconductor layer sequence is epitaxially deposited on the growth substrate, e.g. by means of MOVPE. When forming the composite, the growth substrate is used to mechanically stabilize the semiconductor layer sequence. After attaching the semiconductor layer sequence to the carrier bodies, the individual semiconductor body regions are stabilized by the associated carrier bodies, and so the growth substrate is no longer required for this purpose and can be removed.

Therefore, the growth substrate is removed in particular after forming the composite. Furthermore, the growth substrate is preferably removed before the composite is singulated into the plurality of semiconductor devices. Therefore, the growth substrate can be removed from the whole surface and can be re-used for a further epitaxial method.

According to at least one embodiment of the method, the growth substrate contains, or consists of, sapphire. Sapphire is particularly suitable as a growth substrate for semiconductor material based on a nitride compound semiconductor material.

In the present context, "based on a nitride compound semiconductor material" (or also abbreviated to nitride compound semiconductor material) means that the semiconductor layer sequence or at least a part thereof, particularly preferably at least the active zone and/or the growth substrate, comprises or consists of a nitride compound semiconductor material, preferably $Al_nGa_mIn_{1-n-m}N$, where $0 \le n \le 1$, $0 \le m \le 1$ and $n+m \le 1$. This material does not absolutely have to exhibit a mathematically exact composition according to the above formula. Rather, it may comprise one or more dopants and additional constituents. For the sake of simplicity, however, the above formula includes only the essential constituents of the crystal lattice (Al, Ga, In, N), even if these may in part be replaced and/or supplemented by small quantities of further substances.

As an alternative to sapphire, silicon or silicon carbide can be used for the growth substrate. Silicon is particularly suitable in conjunction with carrier bodies based on silicon. However, it has been shown that nitride compound semiconductor material which is epitaxially deposited on sapphire has an improved crystal quality and thus has optoelectronic properties which are better than in the case of nitride compound semiconductor material deposited on silicon.

However, of course, the method is also suitable for other semiconductor materials, in particular III-V compound semiconductor materials.

According to at least one embodiment of the method, the clearances are at least partially filled with a filler after forming the composite. The clearances can be at least partially filled in particular after forming the composite. Alternatively, the filler can already be formed when forming the composite on the carrier bodies, e.g. in the form of a coating. In particular, the clearances can be completely filled. Filling occurs in particular before the growth substrate is removed. The filler can thus be used to mechanically stabilize the composite, in particular during the removal of the growth substrate or during further steps in the processing of the composite.

According to at least one embodiment of the method, the filler comprises a first sub-region and a second sub-region. In particular, regions of the first sub-region are arranged between the second sub-region and the carrier body located next thereto. For example, regions of the first sub-region are formed to be conformal with the structure of the composite. This means that the form of the first sub-region follows the structure of the composite, in particular the form of the clearance between the carrier bodies. The first sub-region can be applied, for example, by a coating process, for instance vapor deposition or sputtering. A chemical vapor deposition (CVD) process or an atomic layer deposition (ALD) process can also be used. In particular, the first sub-region directly adjoins, at least in places, the carrier bodies.

According to at least one embodiment of the method, the first sub-region remains at least partially in the semiconductor device and the second sub-region is completely removed. In this case, the second sub-region is used in particular to temporarily mechanically stabilize the composite.

For example, the entire filler or a sub-region thereof, for instance the second sub-region, is formed as a temporary filler. A material which can be simply and reliably removed by a solvent or by means of a wet-chemical etching process without the remaining material of the composite being affected is particularly suitable as a temporary filler.

According to at least one embodiment of the method, the filler is at least partially removed when singulating the composite. Singulation occurs in this case at locations at which filler is provided prior to singulation.

According to at least one embodiment of the method, the filler or a sub-region thereof, for instance the second sub-region, is in particular completely removed for singulating the composite. For example, the entire filler or a sub-region thereof, for instance the second sub-region, is formed as a temporary filler.

In particular, the composite can be held together in the lateral direction only via the filler immediately prior to singulation, and so singulation of the composite occurs by removing the filler without a further step.

A lateral direction is understood to be a direction which extends along a main extension plane of the semiconductor layers of the semiconductor layer sequence. Accordingly, a vertical direction is understood to be a direction which extends perpendicular to the main extension plane of the semiconductor layers.

According to at least one embodiment of the method, the filler is removed only along singulation lines during singulation and remains in the semiconductor devices on the sides of the singulation lines. In this case, the semiconductor devices can be singulated for example mechanically, for instance by means of sawing, or chemically, for instance by means of a dry-chemical etching process, or by means of a laser cutting process. In this case, the filler thus forms at least in places the lateral surface of the singulated semiconductor devices. For example, the filler terminates, in regions, flush with the carrier body and/or with the semiconductor body in the lateral direction. In particular, the filler has, in this case, singulation traces which are typical for the singulation process.

For example, a polymer material, for instance an epoxy, a silicone or a polyimide, is suitable as a filler which remains in the singulated semiconductor devices.

According to at least one embodiment of the method, first contacts and second contacts are formed when singulating the composite on the side facing away from the semiconductor regions, wherein the first contacts and/or the second contacts are connected to the associated semiconductor body regions in an electrically conductive manner via through vias through the carrier body. In an embodiment in which only the first contacts or only the second contacts are connected to the associated semiconductor body regions in an electrically conductive manner via through vias through the carrier body, the respective other contact can be connected to the semiconductor body regions in an electrically conductive manner through the material of the carrier body itself.

According to at least one embodiment of the method, the composite is thinned on a rear side facing away from the semiconductor layer sequence. Thinning can ensure that the vertical extent of the semiconductor devices to be produced is further reduced. The carrier bodies are preferably thinned only after the growth substrate of the semiconductor layer sequence has already been removed. During the removal of the growth substrate, the carrier body still has a relatively large thickness and thus a relatively high mechanical stability than is the case after thinning. Furthermore, the composite is expediently thinned only after the clearances are filled with the filler. During thinning, the material of the carrier bodies and also the filler is removed. Alternatively, the carrier bodies can be thinned before the growth substrate is removed.

After thinning, the first contacts and the second contacts can be applied onto the rear side of the composite facing away from the semiconductor layer sequence for the external electrical contacting of the semiconductor devices.

In a deviation therefrom, the carrier bodies can also already be provided in the final thickness and be attached to the semiconductor layer sequence in order to form the composite. A thinning step can be omitted in this case. In order to increase the mechanical stability whilst forming the composite and/or whilst removing the growth substrate, the composite can be arranged on an auxiliary carrier on the rear side facing away from the semiconductor layer sequence.

According to at least one embodiment of the method, the semiconductor layer sequence extends continuously over the semiconductor body regions when forming the composite. The semiconductor body regions are thus sub-regions of a contiguous semiconductor layer sequence in the lateral direction.

According to at least one embodiment of the method, the semiconductor layer sequence is severed upon singulation. Therefore, mutually separate semiconductor bodies for the individual semiconductor devices are only produced upon singulation.

According to at least one embodiment of the method, separating trenches are formed between adjacent semiconductor body regions prior to the singulation. The separating trenches can extend in the vertical direction only partially into the semiconductor layer sequence. Alternatively, the separating trenches can extend in the vertical direction completely through the semiconductor layer sequence, and so adjacent semiconductor body regions are separated from each other by the separating trenches prior to the singulation.

The separating trenches are preferably formed after the growth substrate has been removed. For example, after forming the separating trenches, the composite is formed to be contiguous just over the filler, and so singulation can be achieved by severing the filler in the vertical direction or completely removing the filler.

Alternatively, the separating trenches can be formed prior to removing the growth substrate and in particular also prior to forming the composite. The growth substrate can hold together in particular the already mutually separated semiconductor bodies.

According to at least one embodiment of the method, the semiconductor layer sequence is provided on a growth substrate and the clearances are at least partially filled with a filler after forming the composite. After filling the clearances, the growth substrate is removed and the composite is singulated after removing the growth substrate, wherein the filler is at least partially removed during singulation.

The filler is thus used during singulation to mechanically stabilize the individual carrier bodies. After removing the growth substrate, the filler can be completely severed in the vertical direction or be completely removed for singulation purposes.

According to at least one embodiment of the method, the semiconductor layer sequence is provided on a growth substrate and the growth substrate is removed after forming the composite. On the side of the semiconductor layer sequence facing away from the carrier bodies, a structuring is formed by means of a chemical process and the clearances are at least partially filled with a filler when forming the structuring, said filler being stable with respect to the chemical process.

The filler can be applied after forming the composite or can already be formed on the provided carrier bodies. A nitride, for instance silicon nitride, is, for example, suitable as a chemically stable filler.

According to at least one embodiment, a semiconductor device comprises a semiconductor body which has a semiconductor layer sequence having an active region provided to generate and/or receive radiation, and a carrier body to which the semiconductor body is attached.

According to at least one embodiment of the semiconductor device, the carrier body has, on a rear side facing away from the semiconductor body, a first contact and a second contact for the external, electrical contacting of the semiconductor device. The first contact and the second contact are provided to inject charge carriers into the active region from different sides of the active region during operation of the semiconductor device, and therefore said charge carriers recombine with radiation being emitted. In the case of a radiation receiver, the charge carriers can be discharged from the active region on opposite sides of the active region via the first contact and the second contact. The first contact and the second contact are externally accessible regions of the semiconductor device.

According to at least one embodiment of the semiconductor device, a metallic intermediate layer is arranged between the semiconductor body and the carrier body for the electrically conductive connection between the semiconductor body and the contacts. The metallic intermediate layer is formed in particular to be multi-layered and includes, for example, connection layers for electrically contacting the semiconductor body and/or a connecting layer for an integrally bonded connection between the carrier body and the semiconductor body, e.g. a solder layer.

According to at least one embodiment of the semiconductor device, a side flank of the carrier body is surrounded by a filler at least in regions. In particular, the carrier body is surrounded by the filler along the entire periphery, e.g. in the form of a coating. The filler protects the carrier body, in particular even during production, e.g. against an effect of a wet-chemical etching process.

In at least one embodiment of the semiconductor device, the semiconductor device comprises a semiconductor body which has a semiconductor layer sequence having an active region provided to generate and/or receive radiation, and a carrier body to which the semiconductor body is attached, wherein the carrier body has, on a rear side facing away from the semiconductor body, a first contact and a second contact for the external, electrical contacting of the semiconductor device. Arranged between the semiconductor body and the carrier body is a metallic intermediate layer for the electrically conductive connection between the semiconductor body and the contacts, and a side flank of the carrier body is surrounded by a filler at least in regions.

The metallic intermediate layer comprises in particular sub-regions which are electrically insulated from one another, and so the metallic intermediate layer does not directly connect the first contact and the second contact to each other.

According to at least one embodiment of the semiconductor device, the metallic intermediate layer is surrounded by the filler at least in regions, in particular along the entire periphery of the semiconductor device. The filler can terminate flush with the semiconductor body at a lateral surface of the semiconductor device.

At the lateral surface of the semiconductor device, the filler can comprise traces of a singulation step, e.g. traces of a mechanical singulation such as saw traces or traces of a singulation by laser radiation. However, in a deviation therefrom, the filler can also be free of traces of a singulation step.

According to at least one embodiment of the semiconductor device, the semiconductor body protrudes, as seen in plan view of the semiconductor device, at least in places beyond the carrier body. For example, the semiconductor body protrudes beyond the carrier body along precisely one or along precisely two lateral surfaces of the semiconductor device, particularly mutually adjoining lateral surfaces. For example, the semiconductor body protrudes beyond the carrier body by at least 100 nm and by at the most 10 µm.

According to at least one embodiment of the semiconductor device, the first contact and the second contact are each connected to the semiconductor body in an electrically conductive manner via a through via, and an ESD protective element is formed between the first contact and the second contact and is connected in parallel with the active region. The expression "connected in parallel with the active region" also includes an ESD protective element, such as for example an ESD protective diode, the forward direction of which is oriented anti-parallel to the forward direction of the active region.

For example, the ESD protective element is formed by means of two sub-regions of the carrier body having mutually different conductivity types, and so the carrier body comprises a p-n junction.

The method described above is particularly suitable for producing the semiconductor device. Therefore, features stated in conjunction with the method can also be applied to the semiconductor device, and vice-versa.

Further features, embodiments and developments will be apparent from the following description of the exemplary embodiments in conjunction with the figures.

In the figures:

FIGS. 1A to 1F, 2A to 2E and 3A to 3F show a first, second and third exemplary embodiment respectively, for a method for producing optoelectronic semiconductor devices with the aid of intermediate steps each illustrated in a schematic sectional view; and FIGS. 4 and 5 show a first and second exemplary embodiment respectively, for a semiconductor device in a schematic sectional view.

Identical, similar elements or elements which act in an identical manner are provided with the same reference numerals in the figures.

The figures and the size ratios of the elements with respect to each other, as illustrated in the figures, are not to be considered as being to scale. Rather, individual elements and in particular layer thicknesses, can be illustrated excessively large for improved clarity and/or for improved understanding.

In the first exemplary embodiment of the method described in FIGS. 1A to 1F, a semiconductor layer sequence 2 is provided for producing optoelectronic semiconductor devices. The invention is described by way of example with the aid of a section of the semiconductor layer sequence 2, from which four semiconductor devices are produced during production.

The semiconductor layer sequence 2 includes an active region 25 which is arranged between a first semiconductor layer 21 of a first conductivity type and a second semiconductor layer 22 of a second conductivity type different from the first conductivity type. For example, the first semiconductor layer 21 is p-conductive and the second semiconductor layer 22 is n-conductive, or vice-versa. The invention will be described hereinafter by way of example for a radiation-emitting semiconductor device, such as a luminescent diode, e.g. a light-emitting diode. Of course, the semiconductor device can also be a radiation receiver, for example a photodiode or a solar cell, wherein the active region 25 is provided to receive radiation.

As illustrated in FIG. 1A, the semiconductor layer sequence 2 is provided on a growth substrate 29 for the epitaxial deposition of the semiconductor layer sequence. In the case of a nitride compound semiconductor material for the semiconductor layer sequence 2, sapphire is particularly suitable as the growth substrate. Alternatively, silicon or silicon carbide can also be used.

The semiconductor layer sequence 2 extends in the lateral direction continuously over semiconductor body regions 200, from which one semiconductor body is produced in each case during production of the semiconductor devices. Arranged on a side of the semiconductor layer sequence facing away from the growth substrate 29 are a first connection layer 71 provided for electrically contacting the first semiconductor layer and a second connection layer 72 provided for electrically contacting the second semiconductor layer 22. For ease of illustration, details of the electrical contacting of the semiconductor layers via the connection layers 71, 72 are not shown and the connection layers are illustrated in a greatly simplified manner. One possible way of electrically contacting the first semiconductor layer 21 and the second semiconductor layer 22 by means of the connection layers 71, 72 will be described in more detail with the aid of FIG. 3.

Figure 1B:
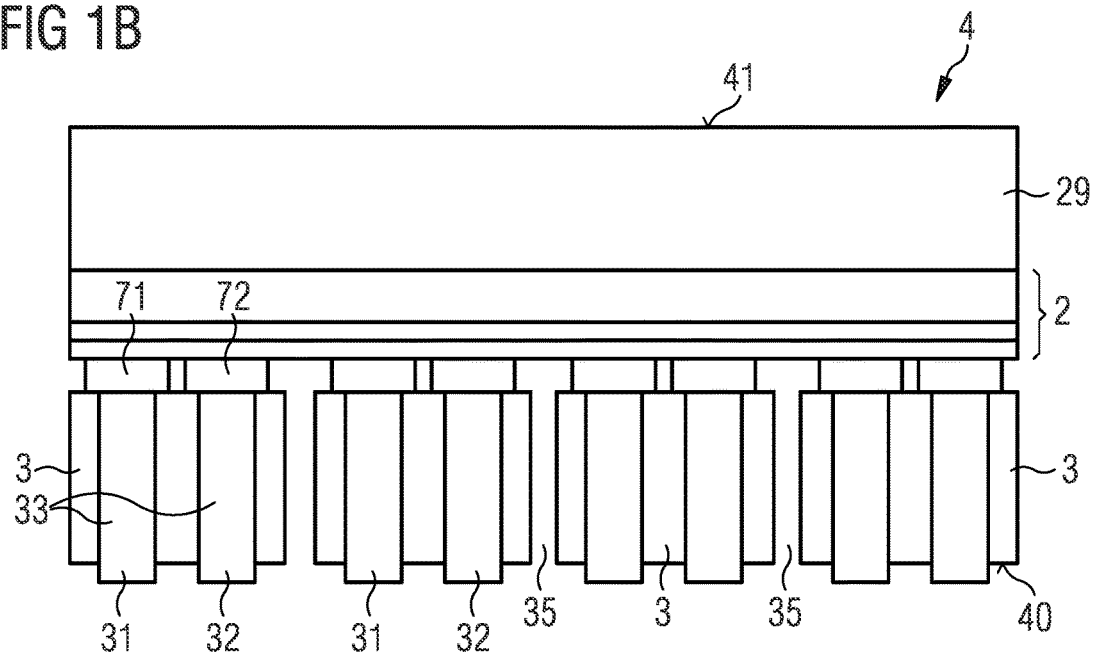
Figure 1C:
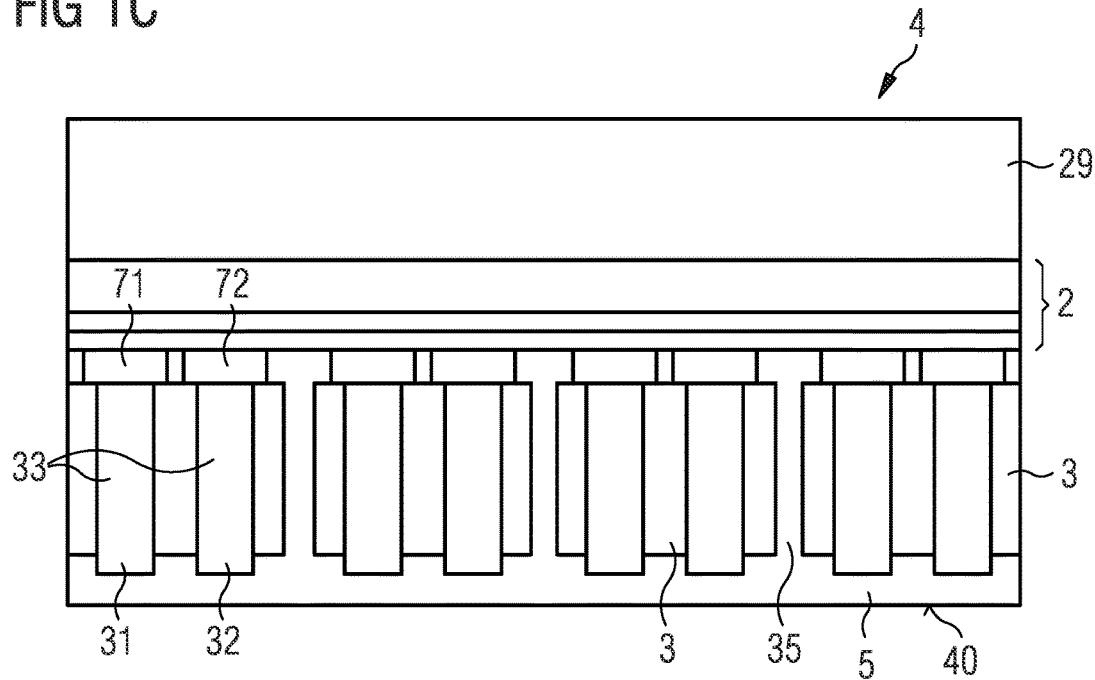

As illustrated in FIG. 1B, a composite 4 is formed, wherein a carrier body 3 is attached to each semiconductor body region 200. The carrier bodies 3 are individual elements which are spaced apart from each other and are separated from each other by clearances 35. The carrier bodies each comprise a first contact structure 31 for electrically contacting the first connection layer 71 and a second contact structure 32 for electrically contacting the second connection layer 72. The first contact structures 31 and the second contact structures 32 each comprise through vias 33 through the carrier bodies 3.

The thus produced composite 4 extends in the vertical direction, i.e. perpendicular to the main extension plane of the semiconductor layers of the semiconductor layer sequence 2 between a rear side 40 and a front side 41, wherein the semiconductor layer sequence faces the front side 41 as seen from the carrier bodies.

In the illustrated exemplary embodiment, the first contact structures 31 and the second contact structures 32 protrude in the vertical direction at the rear side from the carrier body 3. However, this is not absolutely necessary.

The carrier bodies 3 are attached to the semiconductor layer sequence 2, for example, by means of a connecting layer, e.g. a solder layer. When producing the mechanically stable connection between the carrier bodies 3 and the semiconductor layer sequence 2, are reduced owing to differences in the coefficients of thermal expansion between the growth substrate 29 and the carrier bodies 3 compared with a continuously extending carrier, e.g. a carrier wafer, since the carrier bodies 3 each have a comparatively small edge length in the lateral direction. As a result, the risk that differences between the coefficients of thermal expansion of the growth substrate 29 and of the carrier bodies 3 lead to the composite 4 being damaged is minimized. For example, in the case of carrier bodies 3 which contain, or consist of, a semiconductor material such as silicon or germanium, sapphire can also be used as the growth substrate despite the large difference, compared with silicon, in relation to the coefficient of thermal expansion. As a result, semiconductor layers having a particularly high crystalline quality can be produced.

After forming the composite, the clearances 35 between the carrier bodies 3 are filled with a filler 5. A casting process is, for example, suitable for this. A casting process is understood generally to mean a process by means of which a molding compound can be configured into a predetermined shape. In particular, the expression 'casting process' includes casting, injection molding, transfer molding and compression molding.

A polymer material, for instance a silicone or an epoxy, is suitable as the filler, for example. In the embodiment illustrated in FIG. 1C, the filler 5 also forms the rear side 40 of the composite 4. The filler thus completely covers the carrier bodies 3 on the semiconductor layer sequence. In a deviation therefrom, the filler can also be formed such that it only fills the clearances 35 completely or at least in regions.

Figure 1D:
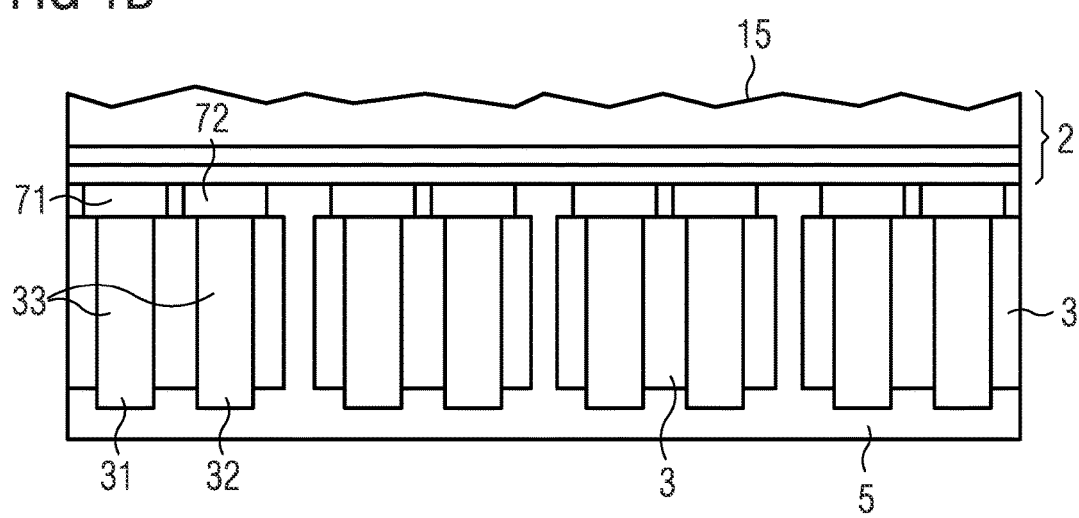
Figure 1E:
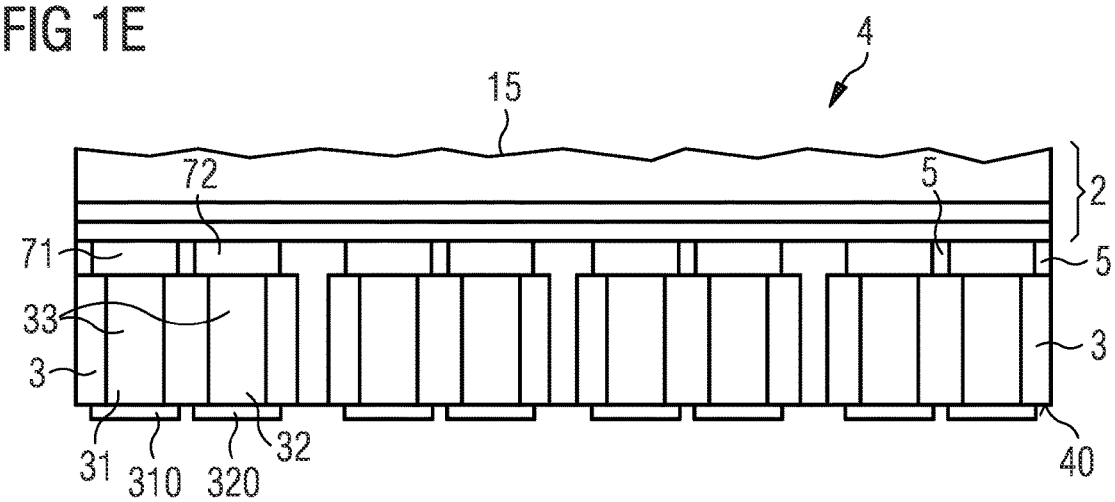

The mechanical stability of the composite 4 is increased by means of the filler 5. Then, as illustrated in FIG. 1D, the growth substrate 29 is removed. In the case of a sapphire growth substrate, a Laser Lift Off (LLO) process is, for example, suitable for this. In this case, complete removal can take place, and so the Laser Lift Off process can be performed regardless of the lateral structuring of the composite 4, i.e. in particular regardless of the size of the semiconductor devices to be produced. It is therefore not necessary to adapt the Laser Lift Off process to the geometry of the semiconductor devices, e.g. by using an excimer laser having a corresponding beam profile.

Alternatively, depending upon the material of the growth substrate, the growth substrate can also be removed by means of wet-chemical or dry-chemical etching, or mechanically, for instance by means of grinding, lapping or polishing. After removing the growth substrate, a structuring 15 can be formed on the side of the semiconductor layer sequence 2 facing away from the carrier bodies 3 in order to increase the out-coupling efficiency, formation being effected for example by means of wet-chemical etching, for instance by KOH in the case of a nitride compound semiconductor material.

Figure 1F:
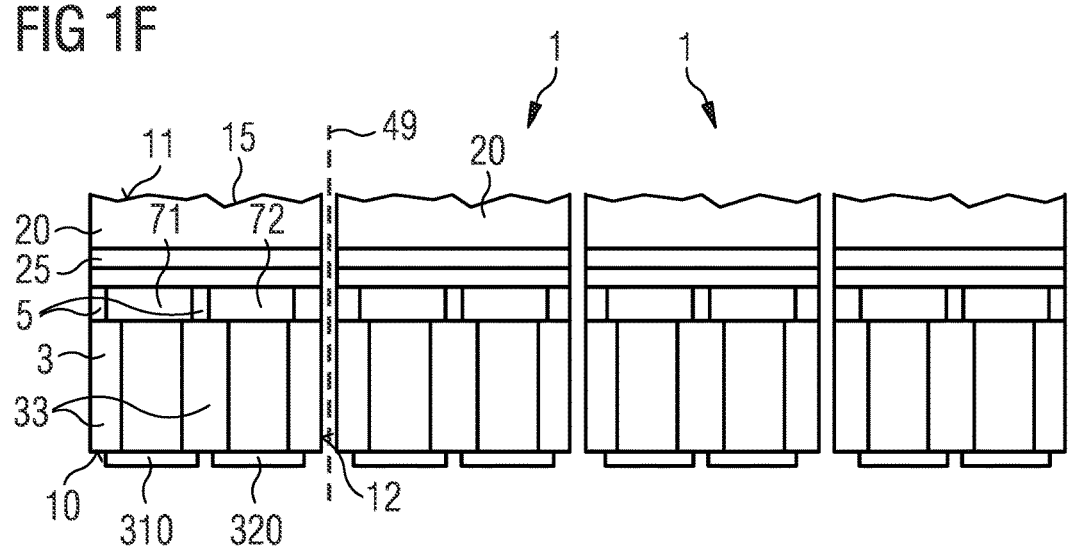

After removing the growth substrate, the composite 4 is thinned from the rear side 40. In this case, material of the carrier bodies 3 and material of the filler are removed. When producing the composite 4 and when removing the growth substrate, the composite 4 is characterized by a high mechanical stability owing to the comparatively large thickness of the carrier bodies 3. After these steps, the carrier bodies can be thinned in order to reduce the height, i.e. the extent in the vertical direction, of the subsequent semiconductor devices. After thinning, first contacts 310 for contacting the first contact structure and second contacts 320 for contacting the second contact structure 32 are formed on the rear side 40 of the composite. Then, the composite 4, as illustrated in FIG. 1F, is singulated along singulation lines 49 into mutually separated semiconductor devices 1, e.g. by sawing, etching or a laser separation process.

In a deviation from the described exemplary embodiment, the carrier bodies can also be thinned before the growth substrate is removed.

The singulated semiconductor devices 1 each comprise one carrier body 3 and one semiconductor body 20. The semiconductor devices 1 are each formed as surface-mountable semiconductor devices which can be electrically contacted on a rear side 10 opposite a radiation exit surface 11. The lateral surfaces 12 of the semiconductor devices produced upon singulation are formed by the semiconductor body 20, the filler 5 and the carrier body 3. The semiconductor body 20, the filler 5 and the carrier body 3 terminate flush with each other in the lateral direction. The edge length of the thus produced semiconductor devices is identical to the lateral extent of the active region 25 along this direction. Semiconductor devices are thus produced whose lateral extent is not greater than the lateral extent of the active region 25 provided for generating radiation. The finished semiconductor devices can then be attached to a connection carrier, e.g. a printed circuit board or a sub-carrier (submount).

In the described production method, the carrier bodies 3 can be prefabricated, at least in part, substantially independently of the production of the semiconductor layer sequence 2, before said carrier bodies are attached to the semiconductor layer sequence 2 in order to form the composite 4. This simplifies the production of the carrier bodies 3. For example, an electronic component, for instance an ESD protective element, can already be integrated into the carrier bodies 3 prior to attaching the semiconductor layer sequence 2. In addition, a high mechanical stability of the semiconductor device can be achieved, in particular between the first contact structure and the second contact structure.

The carrier bodies 3 can further be produced from a carrier whose lateral extent is substantially arbitrary. In particular, in contrast to a method in which a carrier is applied to the whole surface of the semiconductor layer sequence in order to form a composite, the lateral extent is independent of the lateral extent of the semiconductor layer sequence. Furthermore, owing to the at least partially prefabricated carrier bodies 3, galvanic processes are not required to form the contact structures 310, 320 on the semiconductor layer sequence.

Figure 2A:
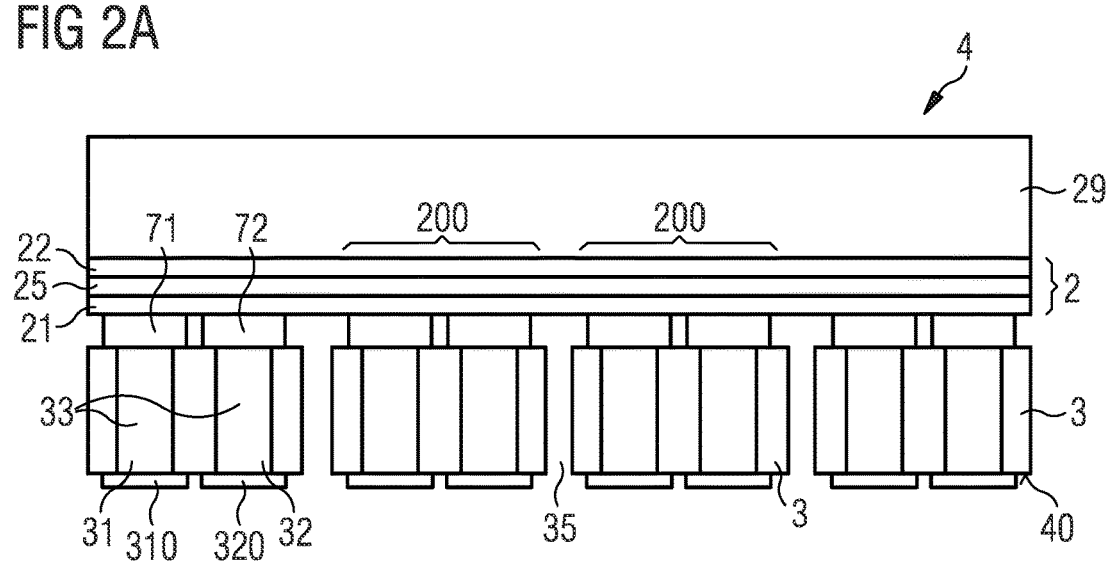

The second exemplary embodiment illustrated in FIGS. 2A to 2E corresponds substantially to the first exemplary embodiment described in conjunction with FIGS. 1A to 1F. FIG. 2A illustrates a production stage in which the composite 4 is already formed with the semiconductor layer sequence 2 and the carrier bodies 3 attached therein. The composite can be formed as described in conjunction with FIGS. 1A and 1B. In contrast to the first exemplary embodiment, the carrier bodies 3 already have the intended final thickness when producing the composite. The first contacts 310 and the second contacts 320 are already formed on the rear side 40 of the composite 4.

Figure 2B:
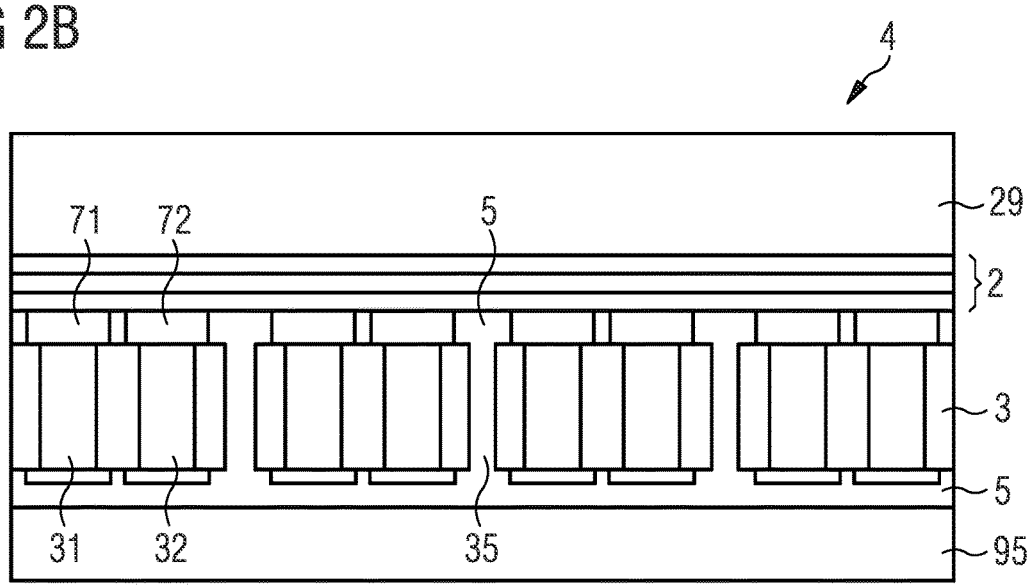
Figure 2C:
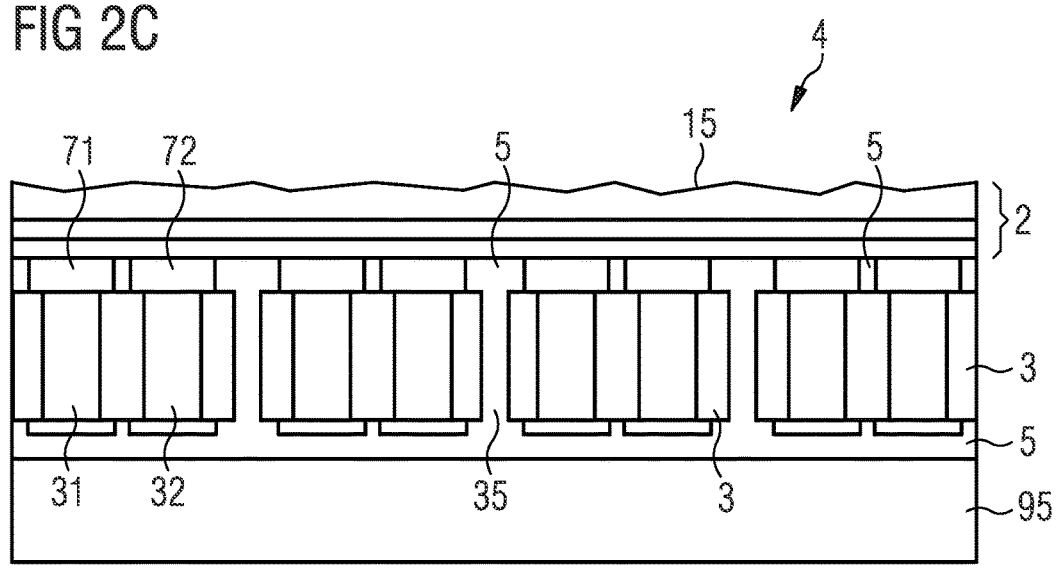

Then, the clearances 35 between the carrier bodies 3 are filled with a filler 5 (FIG. 2B). In order to increase the mechanical stability, an auxiliary carrier 95 is attached to the side of the carrier bodies 3 facing away from the semiconductor layer sequence 2. Then, as illustrated in FIG. 2C, the growth substrate is removed (cf. FIG. 1D).

Figure 2D:
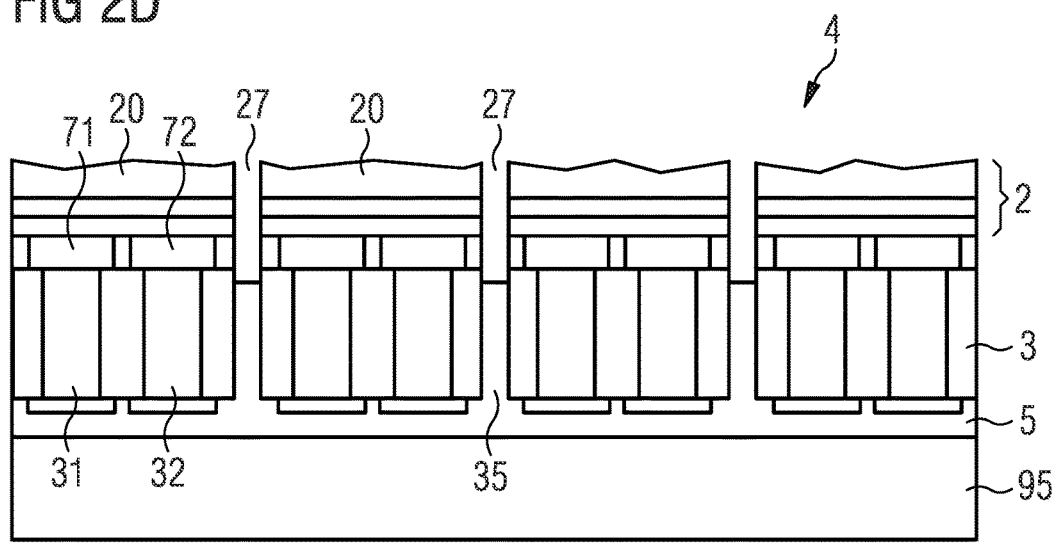
Figure 2E:
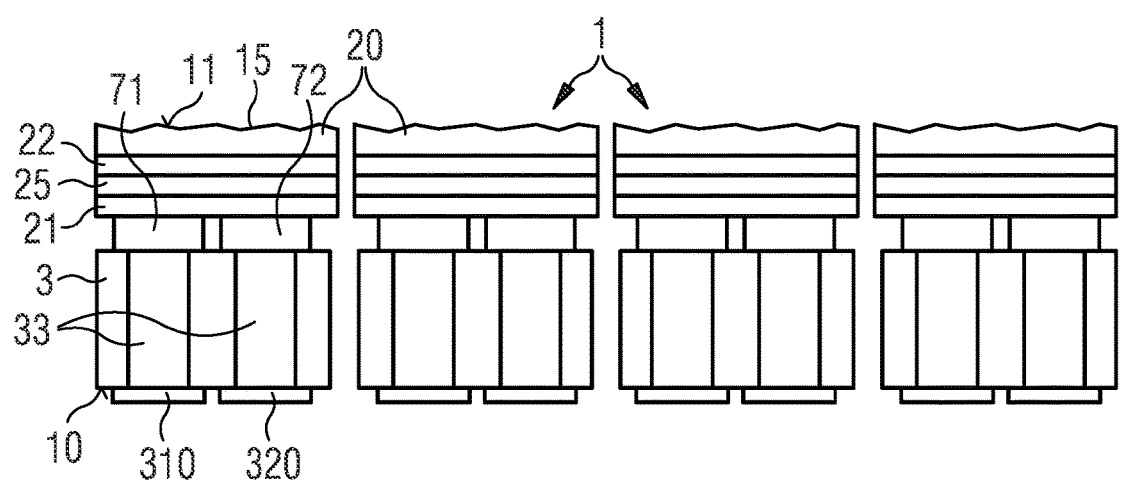

After removing the growth substrate, separating trenches 27 are formed which extend in the vertical direction completely through the semiconductor layer sequence 2 (FIG. 2D). In a deviation therefrom, the separating trenches can extend in the vertical direction through the semiconductor layer sequence only in regions. In the illustrated exemplary embodiment, the separating trenches 27 end in the filler which is located in the clearances 35. After forming the separating trenches, the thus produced semiconductor bodies 20 with the associated carrier bodies 3 are mechanically connected to each other only via the filler 5 and the auxiliary carrier 95. The singulated semiconductor devices 1 are produced, as illustrated in FIG. 2E, by removing the filler 5. In this case, a temporary material which can be easily removed, e.g. by means of a solvent or a wet-chemical etching process, is particularly suitable as the filler. For example, a soluble lacquer can be used. In this exemplary embodiment, the singulated semiconductor devices 1 are free of the filler, except for possible residues of the filler 5 left as a result of the production process.

The second exemplary embodiment illustrated in FIGS. 3A to 3F corresponds substantially to the second exemplary embodiment described in conjunction with FIGS. 2A to 2E.

In contrast thereto, the separating trenches 27 are already formed in the semiconductor layer sequence 2 prior to forming the composite, as illustrated in FIG. 2A.

Figure 3A:
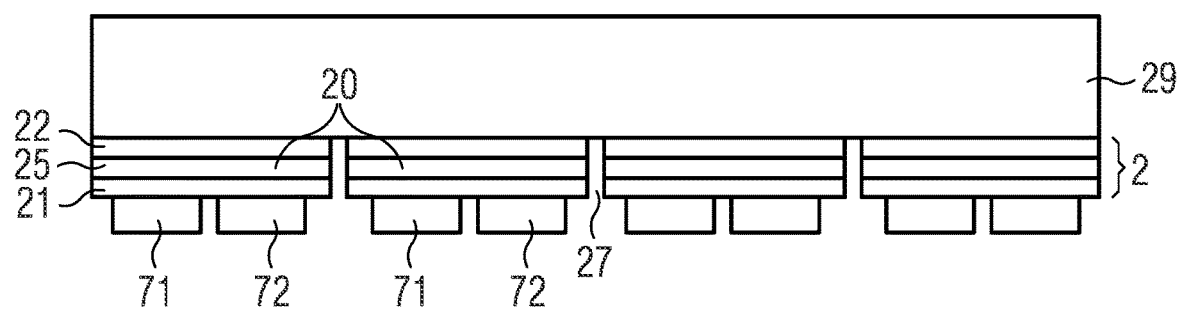
Figure 3B:
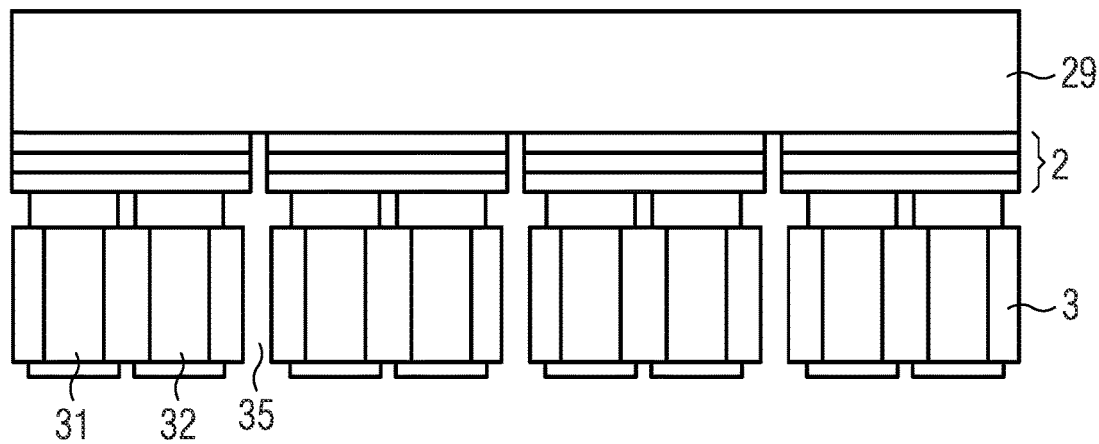

Then, the carrier bodies 3 are attached to the already formed semiconductor bodies 20 in order to form the composite 4, FIG. 3B. This can occur in a similar manner to the previously described exemplary embodiments. In this method stage, the semiconductor bodies and the carrier bodies attached thereto are mechanically contiguous with one another only via the growth substrate 29.

Then, the clearances 35 are filled with a filler 5. In this exemplary embodiment, the filler includes a first sub-region 51 and a second sub-region 52. The first sub-region is formed as a coating which is deposited for example by vapor deposition or sputtering. The first sub-region is conformal with the structure of the composite 4, in particular the shape of the clearances 35. In a deviation therefrom, the filler 5, in particular the first sub-region 51, can also already be attached to the carrier bodies before the composite 4 is formed. In this case, the first sub-region 51 only covers regions of the carrier bodies, in particular the side flanks 302 thereof.

Figure 3C:
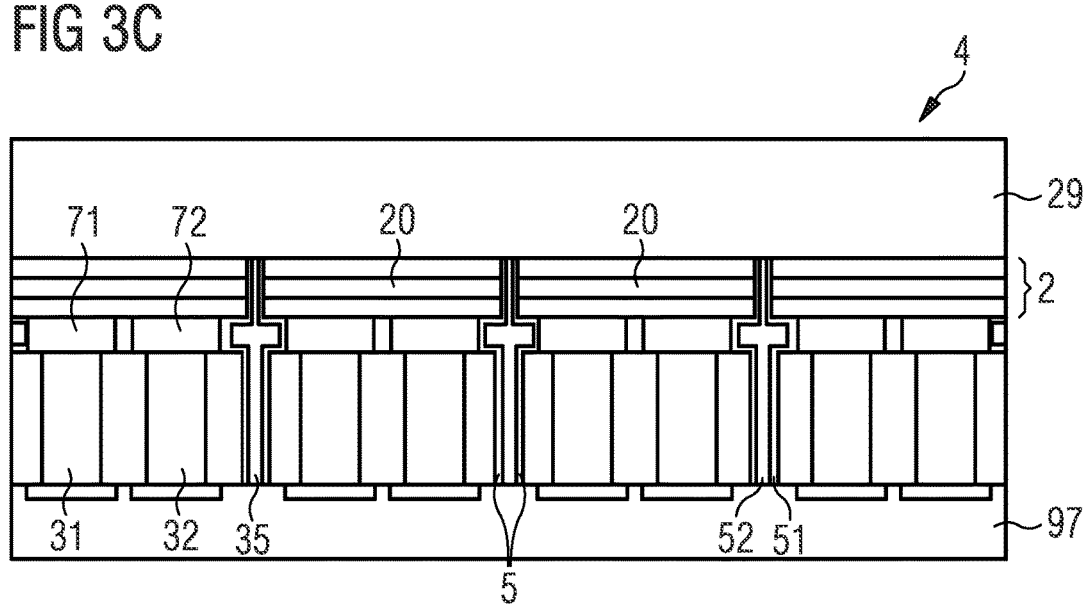

The second sub-region 52 particularly completely fills the remaining clearances. FIG. 3C shows a stage in which the composite is applied to a temporary auxiliary carrier 97 (FIG. 3C).

Figure 3D:
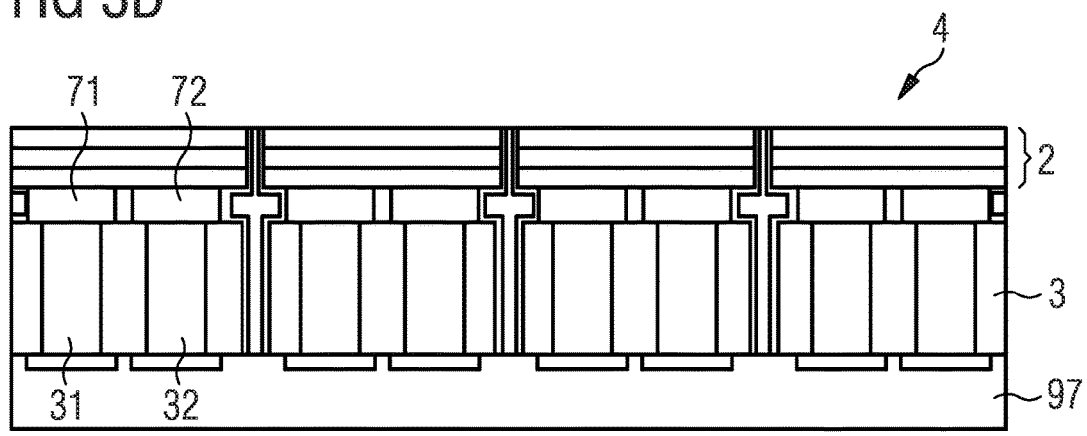
Figure 3E:
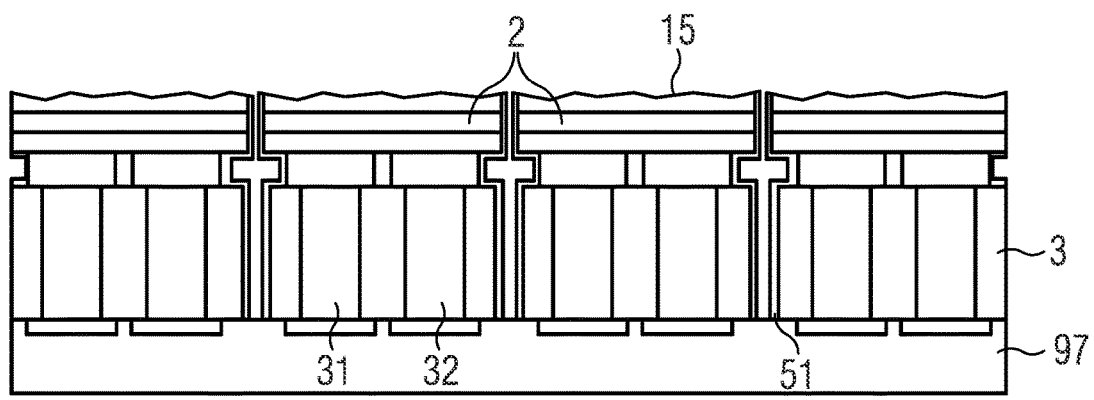

As illustrated in FIG. 3D, the growth substrate is removed, and so the individual semiconductor bodies 20 are located with the carrier bodies 3 on the temporary auxiliary carrier 97. The semiconductor bodies exposed by removing the growth substrate 97 are provided, as illustrated in FIG. 3E, with a structuring 15, e.g. by means of a wet-chemical etching process, for instance by using KOH.

The filler 5, in particular the first sub-region 51, is formed to be stable with respect to the wet-chemical process, and so the carrier bodies 3 are protected during structuring. For example, silicon nitride is suitable as a material which is stable with respect to KOH. In contrast, the material for the second sub-region 52 does not necessarily have to be stable with respect to the structuring process and as a result can be partially or completely removed during the structuring (FIG. 3E). Residues of the second sub-region can optionally be subsequently removed. By removing the second sub-region, the composite 4 is simultaneously singulated into the individual semiconductor devices. Of course, the second sub-region can also be stable with respect to the structuring process and only removed after the structuring process.

The temporary auxiliary carrier 97 is expediently likewise formed to be stable with respect to the structuring process, in particular in the case of a second sub-region 52 which itself is not stable with respect to the structuring process. For example, the temporary auxiliary carrier can contain a polyimide. Such a material is characterized by a comparatively high stability with respect to wet-chemical etching processes and by a good temperature stability.

Figure 3F:
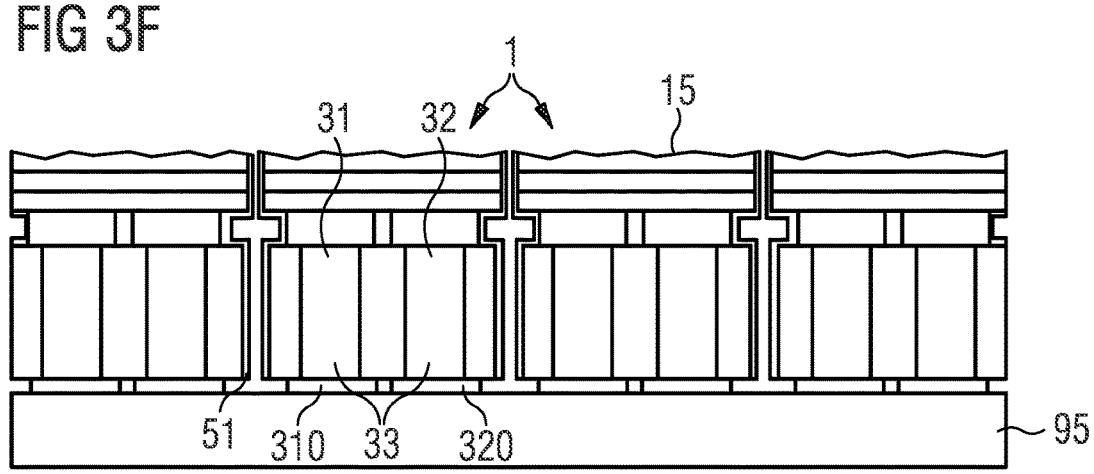

Then, the singulated semiconductor devices 1 can be transferred to an auxiliary carrier 95 on which the semiconductor devices are available for further processing (FIG. 3F). A conventional carrier film is suitable for this.

In the described exemplary embodiment, a filler 5 is used having a first sub-region 51 which remains in the finished semiconductor device and having a second sub-region 52 which is removed during the method. Such a design for the filler 5 can also be used for the previously described exemplary embodiments.

Alternatively, a single filler can also be used in this exemplary embodiment.

An exemplary embodiment for a semiconductor device 1 which can be produced in particular as described in conjunction with FIG. 1A to 1F or 3A to 3F is illustrated in a schematic sectional view in FIG. 4.

The semiconductor device 1 includes a semiconductor body 20 having a semiconductor layer sequence 2. The semiconductor layer sequence includes an active region 25 provided for generating radiation and arranged between a first semiconductor layer 21 facing the carrier body 3 and a second semiconductor layer 22 arranged on the side of the active region 25 facing away from the carrier body 3. The semiconductor body 20 comprises a plurality of recesses 24 which extend from the carrier body through the first semiconductor layer 21 and the active region 25.

The first semiconductor layer 21 is connected to a first connection layer 71 in an electrically conductive manner. The first connection layer can be formed with a single layer or with multiple layers. At least one partial layer of the first connection layer 71 is preferably formed to reflect the radiation generated in the active region 25. For example, silver, palladium or rhodium are characterized by a high reflectivity in the visible spectral range.

Furthermore, the semiconductor device 1 includes a second connection layer 72. The second connection layer is connected in the recesses 24 to the second semiconductor layer 22 in an electrically conductive manner. Regions of the first connection layer 71 extend between the second connection layer 72 and the semiconductor body 20. In order to prevent an electrical short-circuit, a first insulation layer 81 is arranged between the second connection layer 72 and the first semiconductor layer 21 and between the second connection layer and the first connection layer.

Furthermore, a second insulation layer 82 between the first connection layer 71 and the second connection layer 72 is used to provide electrical insulation between these layers.

Charge carriers can be injected into the active region 25 uniformly in the lateral direction via the recesses 24. However, with a sufficiently high transverse conductivity of the second semiconductor layer 22, it is also feasible for the semiconductor body 20 to only have precisely one recess 24.

The carrier body 3 extends in the vertical direction between a front side 301 facing the semiconductor body 20 and a rear side 300 opposite the front side. Through vias 33 are formed in the carrier body 3 and extend in the vertical direction completely through the carrier body 3. A first contact 310 and a second contact 320 are arranged on the rear side 300 of the carrier body and are connected to the first connection layer 71 and the second connection layer 72, respectively, in an electrically conductive manner via the through vias 33. By applying an external electrical voltage between the first contact 310 and the second contact 320, charge carriers can be injected from opposite sides into the active region 25 and can recombine there, with radiation being emitted.

Regions of the carrier body 3 are covered with a third insulation layer 83. A dielectric material, e.g. an oxide, for instance a silicon oxide, or a nitride, for example silicon nitride, is suitable for each of the first insulation layer 81, the second insulation layer 82 and the third insulation layer 83. The expressions "first insulation layer", "second insulation layer" and "third insulation layer" do not imply in this case a sequence in the production of these layers but are merely used to designate different electrically insulating regions.

Furthermore, an ESD protective element 91 is formed in the carrier body 3. The ESD protective element can likewise be externally electrically contacted via the first contact 310 and the second contact 320 and is connected in parallel with the active region 25. In the illustrated exemplary embodiment, the ESD protective element is formed by means of a first sub-region 38 and a second sub-region 39 of the carrier body. These sub-regions have mutually opposed conductivity types. The ESD protective element 91 is thus formed by a p-n junction between the first sub-region 38 and the second sub-region 39.

The first contact structure 31 is connected to the first sub-region in an electrically conductive manner in a first opening 92 of the third insulation layer 83. The second contact structure 32 is connected to the second sub-region in an electrically conductive manner in a second opening 93 of the third insulation layer 83.

The conductivity type of the first sub-region 92 and the first semiconductor layer 21 are opposite each other, and so the forward directions of the ESD protective element 91 and of the active region 25 extend in an anti-parallel manner with each other.

Arranged between the semiconductor body 20 and the carrier body 3 is a metallic intermediate layer 6 which includes, for example, the first connection layer 71, the second connection layer 72 and a connecting layer 73, e.g. a solder layer.

In the illustrated exemplary embodiment, in the lateral direction at least regions of the metallic intermediate layer 6 and the side flanks 302 of the carrier body are completely surrounded by a filler 5. The filler, which is applied, for example, in the form of a coating, is used in particular to protect the carrier body during production, e.g. to protect it against a chemical loading. In a deviation from the described exemplary embodiment, the metallic intermediate layer can also be free of the filler.

In particular, in the case of a semiconductor device which is produced as described in conjunction with FIGS. 1A to 1F, the filler 5 terminates flush with the semiconductor body 20 at a lateral surface 12 of the semiconductor device 1. At the lateral surface 12, the filler comprises traces of a singulation step, e.g. traces of a mechanical removal, for instance sawing traces, traces of a chemical material removal or traces of a laser separation process. In this case, as illustrated in FIG. 1F, the carrier body can also be free of the filler.

The second exemplary embodiment illustrated in FIG. 5 corresponds substantially to the first exemplary embodiment, described in conjunction with FIG. 4, for a semiconductor device. In contrast thereto, the semiconductor body 20 protrudes, as seen in plan view of the semiconductor device, at at least one lateral surface 12 beyond the carrier body 3, e.g. by at least 100 nm and by at the most 10 µm. The semiconductor body can also protrude beyond the carrier body at two lateral surfaces, in particular at two mutually adjoining lateral surfaces. However, the semiconductor body preferably does not protrude beyond the carrier body at two opposite lateral surfaces. For example, the semiconductor body and the carrier body can have the same cross-sectional area as seen in plan view and are arranged in a mutually offset manner. It has been shown that such semiconductor devices can be formed to be compact in a particularly efficient manner. In contrast thereto, in semiconductor devices in which the carrier bodies are formed by severing a carrier wafer when singulating into semiconductor devices, semiconductor bodies do not protrude beyond the carrier body at any point as a result of the production process.

As described in particular in conjunction with FIGS. 1A to 1F and 3A to 3F, the production of an optoelectronic semiconductor device in a particularly compact design is simplified owing to the filler 5. In particular, the semiconductor device is formed as a compact, surface-mounted device (SMD) in the CSP (Chip Size Package) design.

This patent application claims the priority of German patent application 10 2013 111 496.2, the disclosure content of which is hereby incorporated by reference.

The invention is not limited by the description made with reference to the exemplary embodiments. Rather, the invention includes any feature and any combination of features, including in particular any combination of features in the claims, even if this feature or this combination is not itself explicitly indicated in the claims or exemplary embodiments.

The invention claimed is:

1. A method for producing a plurality of optoelectronic semiconductor devices, comprising the steps of:
    a) providing a semiconductor layer sequence having a plurality of semiconductor body regions;
    b) providing a plurality of carrier bodies, which each have a first contact structure and a second contact structure;
    c) forming a composite having the semiconductor layer sequence and the carrier bodies such that adjacent carrier bodies are separated from each other by clearances and each semiconductor body region is connected to the first contact structure and the second contact structure of the associated carrier body in an electrically conductive manner; and
    d) singulating the composite into the plurality of semiconductor devices,
    wherein the semiconductor devices each have one semiconductor body and one carrier body,
    wherein the semiconductor layer sequence is provided in step a) on a growth substrate,
    wherein the clearances are at least partially filled with a filler after step c),
    wherein the growth substrate is removed after the clearances are filled,
    wherein the composite is singulated after removing the growth substrate, and
    wherein the filler is at least partially removed during singulation.

2. The method according to claim 1, wherein the growth substrate contains sapphire.

3. The method according to claim 1, wherein the filler has a first sub-region and a second sub-region, wherein regions of the first sub-region are formed to be conformal with the structure of the composite.

4. The method according to claim 3, wherein the first sub-region at least partially remains in the semiconductor device and the second sub-region is completely removed.

5. The method according to claim 1, wherein the filler is removed to singulate the composite in step d).

6. The method according to claim 5, wherein the filler is removed only along singulation lines during singulation and remains in the semiconductor devices on the sides of the singulation lines.

7. The method according to claim 1, wherein in step d) first contacts and second contacts are formed on the side of the carrier bodies facing away from the semiconductor body regions, and wherein the first contacts and/or the second contacts are connected to the associated semiconductor body regions in an electrically conductive manner via through vias through the carrier body.

8. The method according to claim 1, wherein the composite is thinned on a rear side facing away from the semiconductor layer sequence.

9. The method according to claim 1, wherein the semiconductor layer sequence extends continuously over the semiconductor body regions in step c).

10. The method according to claim 7, wherein the semiconductor layer sequence is severed during singulation.

11. The method according to claim 1, wherein prior to step d) separating trenches are formed between adjacent semiconductor body regions.

12. The method according to claim 1,
- a structuring is formed on the side of the semiconductor layer sequence facing away from the carrier bodies by means of a chemical process; and
- when forming the structuring, the clearances are at least partially filled with the filler which is stable with respect to the chemical process.

* * * * *